United States Patent [19]

Madokoro

[11] Patent Number: 4,997,518

[45] Date of Patent: Mar. 5, 1991

[54] METHOD FOR FORMING AN ELECTRODE LAYER BY A LASER FLOW TECHNIQUE

[75] Inventor: Shoji Madokoro, Tokyo, Japan

[73] Assignee: OKI Electric Industry Co., Ltd., Minato, Japan

[21] Appl. No.: 494,974

[22] Filed: Mar. 16, 1990

[30] Foreign Application Priority Data

Mar. 31, 1989 [JP] Japan .................................. 1-78021

[51] Int. Cl.$^5$ .......................... B44C 1/22; C23F 1/02; C03C 15/00; C03C 25/06

[52] U.S. Cl. .................................... 156/643; 156/644; 156/646; 156/652; 156/656; 156/659.1; 219/121.66; 357/67; 357/71; 437/190; 437/194; 437/203

[58] Field of Search ............... 156/643, 644, 646, 652, 156/656, 659.1, 661.1, 662, 665; 357/65, 67, 71; 219/121.65, 121.66, 121.84, 121.85; 204/192.32, 192.35; 427/38, 39, 53.1, 54.1; 437/189, 190, 192, 194, 197, 198, 199, 203, 228, 245, 246, 248

[56] References Cited

FOREIGN PATENT DOCUMENTS 61-187347 8/1986 Japan .
62-36846 2/1987 Japan .
63-215055 9/1988 Japan .

OTHER PUBLICATIONS

Laser Planarization, by David B. Tuckerman and Andrew H. Weisberg, Solid State Technology, Apr. 1986.

Primary Examiner—William A. Powell
Attorney, Agent, or Firm—Edward D. Manzo

[57] ABSTRACT

A method for forming an electrode wiring by laser flowing a semiconductive wafer having an intermediate insulating film, a contact hole in the film and an Al alloy film serving as a wiring metal film and formed over the intermediate insulating film and the contact hole, which method comprises forming an anti-reflective film on the Al alloy film, irradiating individual IC chips on the semiconductive wafer with a laser beam in such a way that the beam size is larger than an IC chip size and the laser beam is irradiated on an adjacent IC chip in a subsequent irradiation cycle as superposed on a grid line of the semiconductive wafer which has been irradiated with the first laser beam irradiation at least partly, thereby causing the Al alloy film to be metal flow to fill the contact hole. The thus flown Al alloy film on which the anti-reflective film has been formed is subjected to patterning to form a wiring layer.

21 Claims, 4 Drawing Sheets

4,997,518

METHOD FOR FORMING AN ELECTRODE LAYER BY A LASER FLOW TECHNIQUE

BACKGROUND OF THE INVENTION

1. Field of The Invention

This invention relates to a method for forming an electrode layer and more particularly, to a method for forming an Al layer by the use of a laser flow technique.

2. Description of The Prior Art

A typical known wiring method is described with reference to FIGS. 4 and 5 wherein FIGS. 4(a) and 4(b) are, respectively, illustrative views showing the formation steps using a laser flow technique and FIG. 5 shows a beam pattern in the laser flow process.

As is particularly shown in FIG. 4(a), a field oxide film 2 is formed on a non-active region of a Si substrate 1 by the LOCOS method. A gate electrode 3 is the formed on an active region of the Si substrate 1. Source and drain diffusion layers 4 are formed on the surface of the Si substrate 1 at opposite sides of the gate electrode 3. Subsequently, a BPSG film 5 serving as an intermediate insulation film is deposited over the entire surface of the Si substrate 1 on which the source drain diffusion layers have been formed. In order to permit contact with the source drain diffusion layers, contact holes 6 are formed through the BPSG film 5 by the RIE method. Over the entire surface of the BPSG film which has been provided with the contact holes 6, there are successively deposited by sputtering an Al-Si film 7 having a Si content of 1% and an amorphous Si film 8 used as an anti-reflective film. Since the films 7 and 8 are difficult to form in the contact holes 6 by sputtering, the film thicknesses become smaller than in other portions.

Thereafter, an XeCl excimer laser with a wavelength of 308 nm radiates over the IC chip formed on the Si substrate 1. The laser beam irradiation is effected by scanning or directing the beam having a given diameter in the manner shown in FIG. 5. At the time, the beam is projected or directed in such a way that when an adjacent portion is then irradiated, once irradiated portion of the IC chip is again irradiated with the beam in a next cycle at 10 to 50% of the beam size. In other words, while the beam is directed along one locus, it overlaps onto an adjacent path, which path will be more directly radiated at a later time, or will have already been irradiated.

As a result of the irradiation, the Al-Si film 7 flows to fully fill the contact holes 6 therewith as shown in FIG. 4(b). Subsequently, the Al-Si film 8 is subjected to patterning to form an Al wiring layer on the contact holes 6. It will be noted that during the metal flow (of film 7), the amorphous film 8 is molten in the Al-Si film.

In the case of the laser beam irradiation as set out above, it is necessary to superpose the laser beams every irradiation cycle wherein superposed portions of the respective IC chips suffer additional light energy as compared with portions where not irradiated twice by the superposition. In the superposed portions, the Al-Si film 7 abnormally grows with respect to the grain size. In a worst case, the Al-Si film 7 may be lost by evaporation or separation. Thus, the problem arises that the elements formed in the IC chip will be greatly damaged.

Moreover, since the amorphous Si film 8 is molten in the Al-Si film, there is the tendency that the resistance of the Al wiring 7 will increase, or Si nodules will increase in size and number. This leads to the problem that the wiring lifetime is considerably shortened.

SUMMARY OF THE INVENTION

An object of the invention is to provide a method for forming an electrode wiring layer or pattern wherein the damage to elements in IC chips as will be caused by the laser beam superposition can be suppressed to a significant extent.

Another object of the invention is to provide a method for forming an electrode wiring layer or pattern wherein the lowering in quality of the wiring film as will be caused by the residue of an amorphous Si from an anti-reflective film can be prevented.

According to the present invention, there is provided a method for forming an electrode wiring pattern which comprises:

depositing an intermediate insulating film on given portions of a semiconductor wafer and making at least one contact hole in the intermediate insulating film;

depositing an Al alloy film over the at least one contact hole and the intermediate insulating film;

depositing an anti-reflective film on the Al alloy film, thereby forming a plurality of IC chips on the semiconductor wafer, the IC chips being separated from one another through a grid line region;

irradiating the semiconductive wafer having the plurality of IC chips one by one with a laser beam which is so controlled as to have a beam size larger than a chip size and to cause a superposed portion of the beam to be set on a grid line region of the semiconductor wafer until the Al alloy film suffers the metal flowing effect, thereby filling the at least one contact hole with the Al alloy film; and selectively etching the anti-reflective film and the Al alloy film successively thereby forming on the at least one contact hole an Al wiring pattern having the anti-reflective film thereon. The laser beam irradiation and the selective etching procedures set forth above are repeated on all the IC chips on the semiconductive wafer, thereby forming an electrode wiring on the respective IC chips.

The above and other objects, features and advantages of the present invention will become more apparent from the following description taken in conjunction with the accompanying drawings.

DESCRIPTION OF THE PREFERRED EMBODIMENTS

Reference is now made to the accompanying drawings and particularly, to FIGS. 1 through 3 and 6 illustrating one embodiment according to the invention.

Figure 1A:
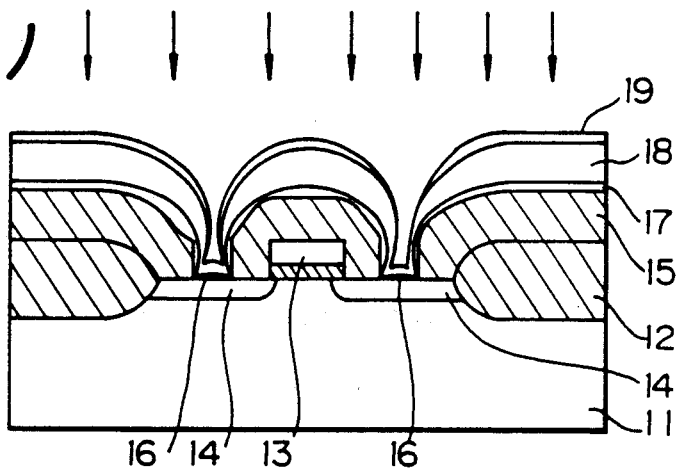
FIGS. 1(a) and 1(b) are, respectively, illustrative views of metal flowing steps using a laser beam according to the method of the invention.
Figure 1B:
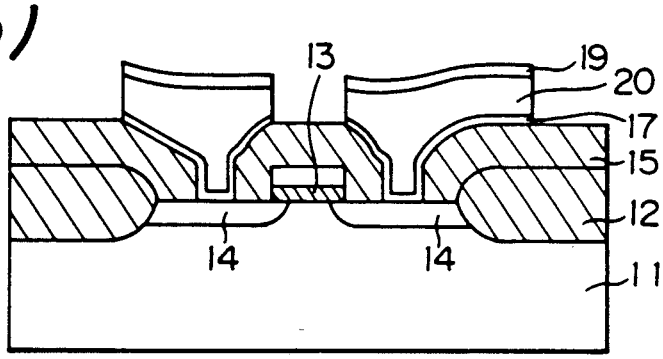
Figure 2:
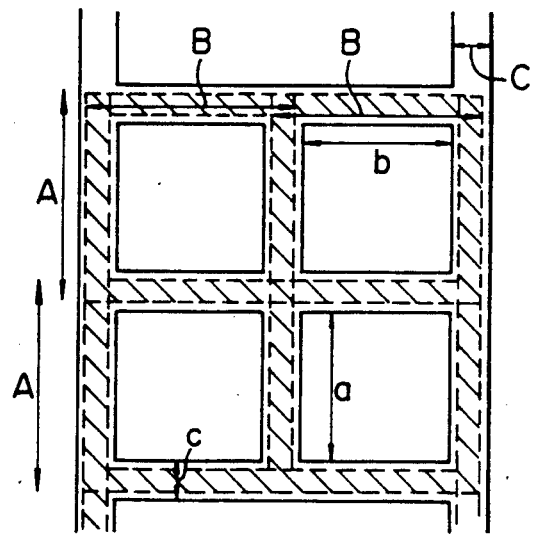
FIG. 2 is a schematic view of a laser beam irradiation pattern according to the method of the invention.
Figure 3:
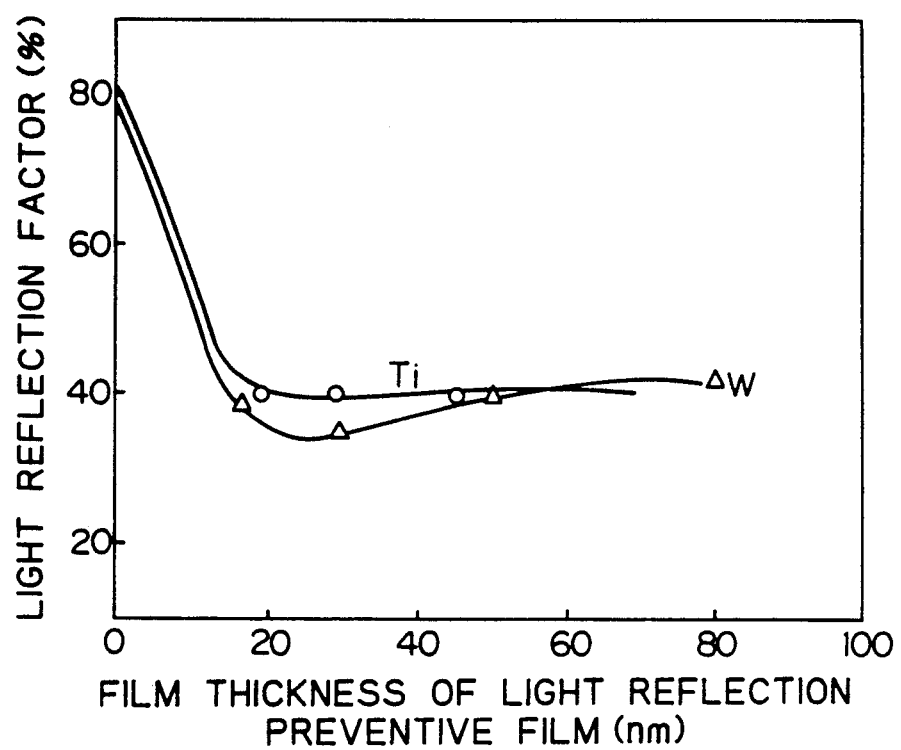
FIG. 3 is a graphical representation of the light reflectance in relation to the variation in thickness of an anti-reflective film.
Figure 4A:
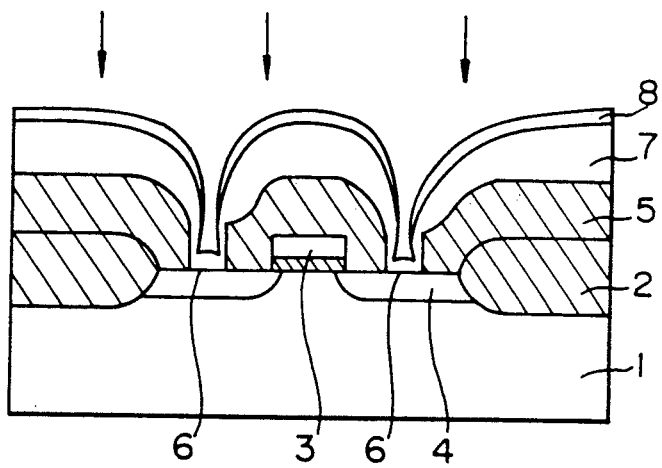
FIGS. 4(a) and 4(b) are, respectively, illustrative views of metal flowing steps using a laser beam according to a known method.
Figure 4B:
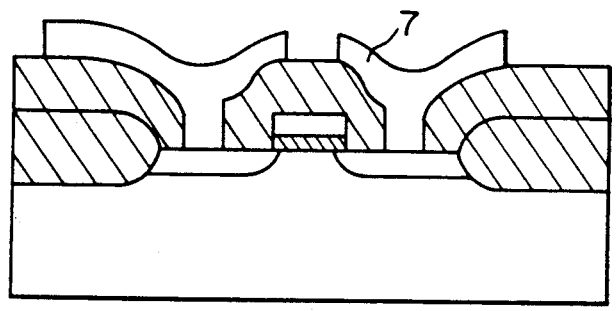
Figure 5:
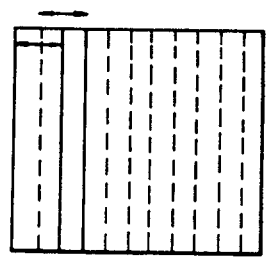
FIG. 5 is a schematic view of a laser beam pattern according to the known method.

FIGS. 1(a) and 1(b) show a process to fabricate an Al alloy wiring pattern on an IC chip, FIG. 2 shows a beam pattern, and FIG. 3 shows a graph of light reflectance in relation to the variation in thickness of the anti-reflective film.

FIG. 1(a) shows a semiconductor wafer 11 such as a Si substrate having a field oxide film 12 formed on a non-active region of the wafer 11 by a LOCOS method. On (or just above, as shown) a given portion of an active region of the wafer 11 is a gate electrode 13. Subsequently, source drain diffusion layers 14 are formed on the surface of the Si substrate 11 (adjacent) at both sides of the gate electrode 13. In this state, a BPSG film 15 serving as an intermediate insulating film is deposited over the entire surface of the Si substrate 11 where the film 12 and the layers 14 have been formed. Thereafter, the BPSG film 15 is selectively removed by etching to form contact holes 16 by the RIE (reactive ion etch) method so that the source drain diffusion layers 14 are exposed. Then, a refractory metal layer 17, such as a Ta-Si film as a barrier metal, with a thickness of, for example, 1000 angstroms and an Al alloy film 18, such as an Al-Si film, with a thickness of, for example, 0.6 μm are successively deposited over the entire surface of the Si substrate 11 as shown. A tungsten (w) film 19 used as an anti-reflective film is formed on the Al alloy film in a thickness of not less than 20 nm, for example, in a thickness of 300 angstroms. Thus, an IC chip die is formed on the Si substrate or wafer 11. In this manner, a plurality of IC chips dies are formed on the substrate 11 although not particularly shown in the figures.

In the practice of the invention, the thus processed semiconductor wafer 11 is heated with a laser beam.

Figure 6:
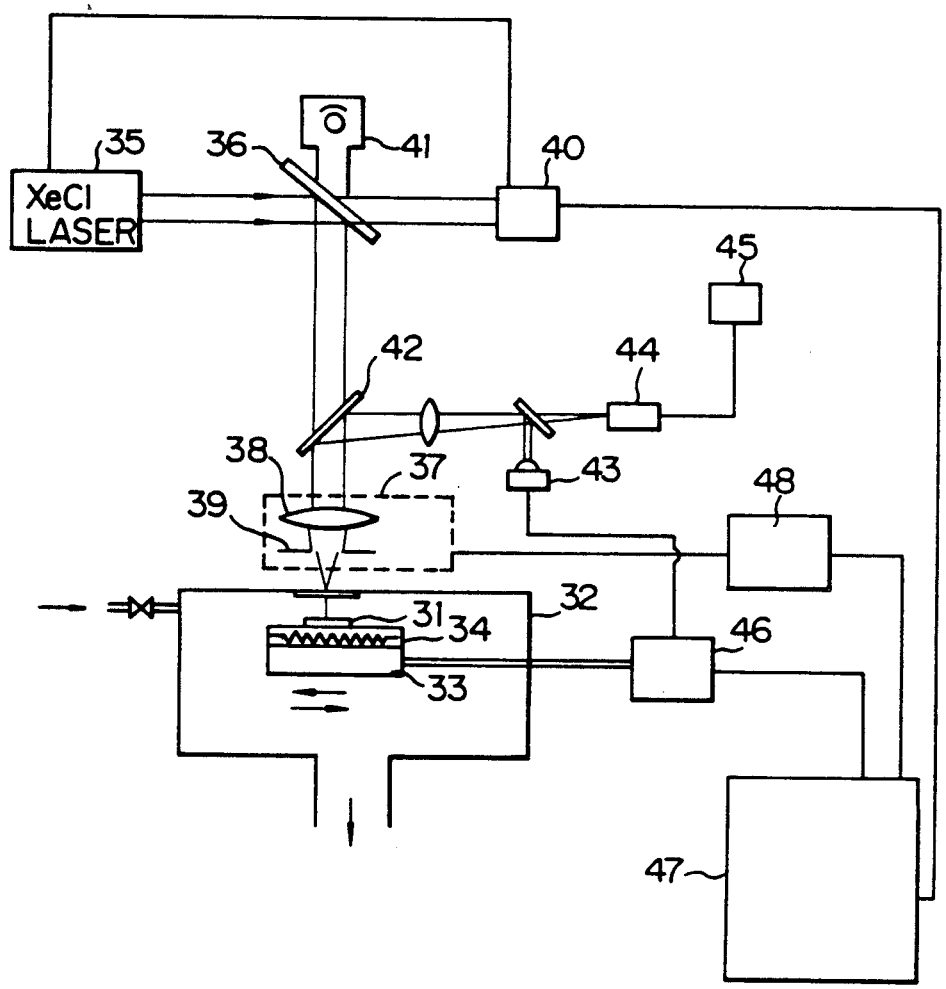
FIG. 6 is an illustrative view of an apparatus for causing of metal flow on a semiconductor wafer with a laser beam.

FIG. 6 schematically shows a laser beam irradiating apparatus. In this figure, the semiconductor or Si wafer is indicated at 31. The Si wafer 31 is mounted on a stage 33 of an XY table provided in a chamber 32 and heated with a heater 34. The heating temperature should be higher than a recrystallization temperature of Al, which may be in the range of from 150° to 200° C. although depending on the manner of formation of the Al alloy film 18, but within a range where no influence in given on the elements formed on the wafer 31. Generally, the temperature is approximately 300° C. The chamber 31 should be in an atmosphere of an inert gas or should be reduced to a pressure of $10^{-3}$ Torr., by the use of a vacuum pump (not shown). By this, the tungsten film 19 is prevented from oxidation when heated.

The wafer 31 in a heated state is subjected to irradiation with a laser beam from an XeCl laser 35. The laser beam used may be one which has a frequency of 100Hz, the pulse width number of 10 nsec. and a wavelength of 308 nm. The laser beam is reflected at a half mirror 36 and passed through an optical system 37 to irradiate the surface of the wafer 31. The optical system 37 includes a lens 38 and an aperture 39 resembling the shape of the respective IC dies, and is used to control the laser beam with a size A×B discussed hereinafter and a beam energy of 2.5 to 3.0 j/cm². The oscillated laser beam intensity is controlled by detecting the beam, which has been slightly passed through the mirror 36, with a controller 40 and controlling the XeCl laser 35 based on the detected signal. Whether or not the laser beam is properly irradiated on an intended IC die is determined as follows: the beam from an arc lamp 41 is slightly reflected at a half mirror 42 and the thus separated beam is detected with a photodiode 43 and a camera 44, through which the beam is monitored as 45. The signal is transmitted to an XY stage controller 46, enabling one to move the XY stage in position. The signals set out above are inputted to a host computer 47, which control the individual controllers and the optical controller 48 to control the optical system 37.

When one IC die on the wafer 31 is heated with the laser beam, the following relationships between a beam size, A×B, and an IC die size, a×b, illustrated in FIG. 2 should be satisfied.

$$A = a + C \times (0.6-0.8) \times 2 \text{ mm}$$

$$B = b + C \times (0.6-0.8) \times 2 \text{ mm}$$

Wherein C represents a grid line width.

In a subsequent irradiation cycle, the beam should be irradiated on an adjacent IC chip as superposed with the first beam at $C \times (0.2-0.6)$ mm.

If a single IC die is to be irradiated, a small size laser sufficient for usual laser beam irradiation may be used. If the laser has high output power, two adjacent IC dies or four IC dies may be thermally treated by the irradiation at one time. When a number of IC dies arranged as a group in n lines and m rows are heated with a laser beam, the beam size, An×Bm, should satisfy the following relationships.

$$An = n \times a + (n-1)C + C \times (0.6-0.8) \ 2 \text{ mm}$$

$$Bm = m \times b + (n-1)C + C \times (0.6-0.8) \times 2 \text{ mm}$$

wherein C has the same meaning as defined above.

The superposed size of the laser beam with a laser beam applied in a subsequent cycle for another group of the IC chips should likewise be in a range of $C \times (0.2-0.6)$ mm.

The aperture 39 of the optical system 37 used for this purpose should resemble the shape of the total dies in n lines and m rows.

As is particularly shown in FIG. 1(b), the Al-Si film 18 is metal-flown to fill the contact holes 16 therewith. Thereafter, the film 19 is subjected to patterning in a desired shape according to a photolithographic technique e.g. a RIE procedures using CF₄ gas. Moreover, the Al-Si film 18 and the Ta-Si film 17 are successively patterned, for example, according to the RIE procedure using BCl₃ gas, thereby completing an Al wiring layer or conductor 20.

When the film 19 used as an anti-reflective film is made, for example, of tungsten, it exhibits a very high light absorption coefficient of $9 \times 10^5$ cm$^{-1}$ relative to UV light with a wavelength of 308 nm. In addition, as shown in FIG. 3, the light reflectance or reflectivity can be satisfactorily reduced even when a tungsten film 19 having a thickness of approximately 300 angstroms is used for the W/Al-Si/SiO₂/Si structure. This means a high light absorption efficiency of the Al-Si film 18, with the possibility of enlarging the beam size. According to the RBS analysis, when the substrate temperature is 300° C., the W film 19 and the Al-Si film 18 are difficult to react with each other. The reaction between the W film 19 and the Al-Si film 19 is minimized since the wavelength of the irradiation beam is short and, thus, the depth of transmitted light is at most (several) tens of angstroms. Moreover, since the wettability of Al on the Ta-Si film 17 serving as a barrier metal is good, the flowing of Al is possible at a small beam energy. Thus, the elements beneath the Ta-Si film 17 are suppressed from being damaged.

The anti-reflective film 19 is not limited to tungsten. Other metal or alloy films which are difficult to react with Al, such as TiW film, TiN film, Ti film, Cu film and Mo film may be used. The Al alloy used as the film 18 may be not only Al-Si, but also Al-Si-Cu, Al-Si-Ti and the like.

As will be apparent from the foregoing, since an anti-reflective film is formed on an Al alloy film, the light absorption efficiency of the Al alloy film is improved, making it easy to give a beam size larger than a chip size. Moreover, the wafer made of Si is heated at temperatures higher than the recrystalization temperature of Al, so that the flowing of Al by a relatively small energy is possible. The superposed portion of laser beams which are, respectively, applied to adjacent IC chips is set on the grid line region. This ensures irradiation of the laser beam on the respective IC chips at a uniform intensity. This is advantageous in that the elements including the Al wiring layer are suppressed from damaging with a significantly improved yield of IC chips.

Since the anti-reflective film and the Al alloy film are not reacted with each other, the Al alloy film is protected from deterioration. The anti-reflective film serves as a protective film of the Al alloy film, the formation of hillocks in the Al alloy film can be prevented, coupled with an improvement in migration lifetime.

Although the invention has been described in its preferred form with a certain degree of particularity, it is to be understood that many variations and changes are possible in the invention without departing from the scope thereof.

What is claimed is:

1. A method for forming an electrode wiring conductor on a semiconductor wafer which comprises the steps of:
    depositing an intermediate insulating film on portions of the semiconductor wafer and making a contact hole in the intermediate insulating film;
    depositing an aluminum (Al) alloy film over said contact hole in the intermediate insulating film;
    forming an anti-reflective film on the Al alloy film, and forming a plurality of IC dies on the semiconductor wafer, the IC dies being separated from one another by a grid line region;
    successively irradiating one or more of the IC dies on said wafer with a laser beam controlled to have a beam size larger than a die size and to cause a superposed portion of the beam to be set on a grid line region of the semiconductor wafer until the Al alloy film flows, thereby filling said contact hole with the Al alloy film; and
    selectively etching the anti-reflective film and the Al alloy film successively, thereby forming on said contact hole an Al wiring conductor having the anti-reflective film thereon.

2. A method according to claim 1, wherein said anti-reflective film is a refractory metal film which is difficult to react with the Al alloy and said refractory metal film is left on said Al alloy film after the selective etching.

3. A method according to claim 1, wherein said anti-reflective film comprises a member selected from the group consisting of W, TiW, TiN, Ti, Mo and Cu.

4. A method according to claim 1, wherein said anti-reflective film has a thickness of not less than 20 nm.

5. A method according to claim 1, further comprising another refractory metal film formed below the Al alloy film.

6. A method according to claim 5, wherein said another refractory metal film is made of Ta-Si.

7. A method according to claim 1, wherein the laser beam irradiation is effected in such a way that the semiconductive substrate is heated to a recrystalization temperature of the Al alloy.

8. A method according to claim 1, wherein said laser beam has a wavelength in a UV light range.

9. A method according to claim 1, wherein the laser beam irradiation is effected in an inert gas atmosphere.

10. A method according to claim 1, wherein the laser beam irradiation is effected at a reduced pressure.

11. A method according to claim 1, further comprising repeating the laser beam irradiation and the selective etching procedures on all the IC dies on the semiconductive wafer, thereby forming an electrode wiring conductor on all of the IC dies.

12. A method of processing a seimconductor wafer to form electrode wiring conductors on integrated circuit dies on the wafer, the dies being delineated by a grid line region, comprising the steps of:
    establishing an intermediate insulating film on the wafer and forming a contact hole in said film;
    establishing an aluminum alloy film over said contact hole;
    establishing an antireflective film on said alloy film;
    irradiating one or more of said dies successively with a laser beam controlled to have a beam size larger than the size of a die and causing said beam to set on said grid line region until said alloy film flows to fill said contact hole; and thereafter
    selectively etching the antireflective film and alloy film to form the elctrode wiring conductors.

13. The improved method of claim 12 further comprising the step of forming an antireflective film on said alloy film prior to said irradiating step.

14. An improved method of processing a semiconductor wafer to form electrode wiring conductors on integrated circuit dies on the wafer, comprising the steps of:
    configuring the dies to be separated by a grid line region of the wafer;
    establishing an aluminum alloy film upon said dies; and
    irradiating one or more of said dies successively with a laser beam controlled to have a beam size larger than the size of a die and causing said beam to set on said grid line region until said alloy film flows to fill a contct hole.

15. The method of claim 14 further comprising the step of forming an antireflective film on said alloy film prior to said irradiating step.

16. The method of claim 15 further comprising selectively etching said antireflective film and said alloy film.

17. The method of claim 14 further comprising forming an intermediate insulating film upon portions of said dies, forming a contact hole in said intermediate insulating film;
    wherein said step of establishing an aluminim alloy film occurs after said step of forming a contact hole, and wherein said aluminum alloy film is established over said contact hole.

18. The method of claim 16 further comprising forming an intermediate insulating film upon portions of said dies, forming a contact hole in said intermediate insulating film;

wherein said step of establishing an aluminim alloy film occurs after said step of forming a contact hole, and wherein said aluminum alloy film is established over said contact hole.

19. The method of claim 1 wherein said dies are irradiated one by one.

20. The method of claim 12 wherein said dies are irradiated one by one.

21. The method of claim 14 wherein said dies are irradiated one by one.

* * * * *